United States Patent
Tyagi

(10) Patent No.: US 6,200,879 B1
(45) Date of Patent: Mar. 13, 2001

(54) USING EPITAXIALLY GROWN WELLS FOR REDUCING JUNCTION CAPACITANCES

(75) Inventor: Sunit Tyagi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/210,271

(22) Filed: Dec. 10, 1998

Related U.S. Application Data

(62) Division of application No. 08/998,257, filed on Dec. 29, 1997.

(51) Int. Cl.[7] .................................................. H01L 21/76
(52) U.S. Cl. ........................... 438/413; 438/222; 438/416
(58) Field of Search ................................ 438/221, 222, 438/357, 404, 413, 424, 429, 442, 481, 199, 416

(56) References Cited

U.S. PATENT DOCUMENTS

| | | |
|---|---|---|
| 4,628,591 * | 12/1986 | Zorinsky et al. ................... 438/409 |
| 4,729,964 | 3/1988 | Natsuaki et al. ....................... 437/29 |
| 4,951,102 | 8/1990 | Beitman et al. ..................... 357/23.4 |
| 5,323,040 | 6/1994 | Baliga .................................. 257/332 |
| 5,504,359 | 4/1996 | Rodder ................................. 257/329 |
| 5,827,763 | 10/1998 | Gardner et al. ...................... 438/232 |

* cited by examiner

Primary Examiner—John F. Niebling
Assistant Examiner—Christopher Lattin
(74) Attorney, Agent, or Firm—Blakely, Sokoloff, Taylor & Zafman LLP

(57) ABSTRACT

The present invention is a semiconductor device having and a method for forming wells by growing an epitaxial silicon layer wherein the epitaxial silicon layer has at least three silicon sublayers. The first sublayer is highly doped, the second sublayer is less doped, and the third sublayer is also highly doped. The use of the epitaxially grown wells allows for the placement of high dopant concentrations in regions of the well where electrical isolation is an issue and the placement of lower doped concentrations in regions of the well where electrical isolation is not as great an issue in order to help reduce the problem of parasitic capacitance.

16 Claims, 7 Drawing Sheets

(PRESENT INVENTION)

USING EPITAXIALLY GROWN WELLS FOR REDUCING JUNCTION CAPACITANCES

This application is a Div. of application Ser. No. 08/998,257 filed Dec. 29, 1997.

BACKGROUND OF THE INVENTION

1. Field of the Invention

The present invention is related to the field of semiconductor device fabrication and more specifically to a semiconductor device and method of forming that device which reduce junction capacitance while maintaining device isolation.

2. Background Information

In the manufacture of semiconductor devices it has become common practice to build devices side by side and stack them one on top of another. As semiconductor devices become more dense, however, there have been increasing problems with keeping one device electrically isolated from another device. When an operating voltage is applied to a junction of a semiconductor device, the operating voltage can create a depletion region next to the junction. The depletion region is formed when the electric field is not zero thereby taking away all the carriers (thus there is a loss of charges) leaving behind only an ionized fixed impurity charge.

So, for example, when an operating voltage is applied to a drain region of a transistor, that operating voltage may cause a depletion region to grow under the gate region of that transistor. If the depletion region under the gate electrode becomes too large then the source region will no longer be isolated from the drain region. Thus, the source region will show a voltage the same as that of the source region. As another example, where there are two semiconductor devices side by side and an operating voltage is applied to both devices, then both devices will be creating depletion regions. Should those depletion regions touch then the devices are no longer electrically isolated. As yet another example, if two devices are close together and an operating voltage is applied to only one of the devices (first device), but the depletion region grows to a point where it is close to the other device (second device), then the current created at the first device may show up across the second device and the devices are no longer electrically isolated.

One prior art method for helping to control the growth of the depletion regions is to dope the wells in which the depletion regions grow. FIG. 1a illustrates the formation of a doped well. For example, a manufacturer may start with a highly doped P-type layer ($P^{++}$ layer) 100. On top of $P^{++}$ layer 100 an undoped N-type layer (n-well) 110 is deposited. The undoped n-type layer is then implanted with dopants 120 to form a doped N+well portion 125, as illustrated in FIG. 1b.

FIG. 1c illustrates a trench 130 formed in the n-well 110. Trench 130 is an isolation trench which isolates one active region from another active region. As illustrated in FIG. 1d, trench 130 has been filled and there is an active region on each side of trench 130. As an example of a semiconductor device, this description illustrates a transistor being formed in the active regions adjacent trench 130. An oxide layer 140 and a polysilicon layer 150 have been deposited and patterned into gate electrodes above n-well 110. Next, the source and drain regions 160 are formed in the n-well 110 adjacent the gate electrodes to complete the transistor, as illustrated in FIG. 1d.

It should be noted that all the deposition and patterning processes of trenches and device layers, such as photoresist masking and etching trench oxide and gate layer, are well known in the art and are therefore not described in detail herein. Additionally, the processes for forming the source and drain regions are also well known in the art and therefore the detail of such processes is not described.

The increased dopants in the n-well 110 decreases the growth of the depletion regions when an operating voltage is applied to one of the junctions of the semiconductor device. However, in order to effectively reduce the growth of depletion regions a high level of doping is required. One problem with high level doping of this prior art approach is that the dopants being implanted 125 can diffuse throughout the n-layer 110 making it hard to control the dopant profile of the well. Thus, you get a higher concentration of dopants at the top of the well but you may also get dopants in the middle and bottom of the well, where dopants may not necessarily be desired.

Another problem with this prior art approach is that there are trade-offs for decreased depletion region growth. For example, the width of the depletion region is inversely proportional to the capacitance of that region, thus smaller depletion regions will cause higher parasitic capacitances. In other words, this prior art technique trades off the electrical isolation for higher parasitic capacitances. Parasitic capacitances reduce the speed of the circuit and degrade performance.

Another prior art technique that is used in combination with the increased dopant technique to try to reduce the problem of increased parasitic capacitance is the use of a deep retrograde shell and a compensation implant. A deep retrograde well is so named because the doping density peaks deep inside the silicon and the doping reduces closer to the surface. A compensation implant is used to reduce the effective doping of the well. FIG. 1f illustrates the use of the combination of retrograde wells and compensation implants 170. After the source and drain regions are formed, for example out of $P^+$ type implants, another dopant implant, for example P type implants, is performed. The set up is such that the P type implant is positioned just below the source and/or drain regions near the trench 130. This technique helps to alleviate some of the problems of parasitic capacitance because the compensation implants are not as highly doped as the source and drain regions or the n-well in those areas.

However, there is still the problem of control when implanting dopants because the dopants may diffuse to other areas or because implant techniques are not perfectly accurate and thus the compensation implant may be placed in the wrong area. The addition of the compensation implants also increases process steps and increases manufacturing costs both of which may cause their own host of problems in device fabrication.

Yet another prior art method for improved electrical isolation is to etch the trenches deeper into the well. Such an idea sounds simple enough however the actual process steps to do so are very complex and often cost prohibitive. The more complex the processing the more likely the chances of problems arising during fabrication and the more process steps added the higher the fabrication cost. Additionally, as devices become more dense the trenches will have to become narrower making them harder to etch and even harder to fill. If for example a narrow trench cannot be completely filled voids will form which may cause electrical isolation problems of their own.

Thus, what is needed is a method and structure for wells that control depletion region growth and reduce parasitic capacitances.

SUMMARY OF THE INVENTION

The present invention is a semiconductor device having and a method for forming wells by growing an epitaxial silicon layer wherein the epitaxial silicon layer has at least three silicon sublayers. The first sublayer is highly doped, the second sublayer is less doped, and the third sublayer is also highly doped.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A Semiconductor Device and a Method for Forming a Semiconductor Device Using Epitaxially Grown Wells for Reducing Junction Capacitances is disclosed. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

It should be noted that, the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing portions of an integrated circuit during fabrication are not drawn to scale, but instead are drawn so as to illustrate the important features of the invention.

The present invention is a semiconductor device and method of making a semiconductor device having an epitaxial grown silicon well with varying dopant levels. The epitaxially grown silicon sublayers have dopant levels that are strategically grown in order to aid in the electrical isolation of semiconductor devices and to reduce the problem of parasitic capacitance. One embodiment of the present invention grows an epitaxial layer with sublayers having different doping levels by changing the amount of dopants during the growth process to form a graded well.

It should be noted that although the following description describes embodiments with specific arrangements of p-type and n-type wells, other arrangements of p-type, n-type, and combinations of the two with many different doping levels may be used and still preserve the essence of the present invention. It should also be noted that although the growth of the epitaxial layer of the present invention is described as being performed in a single step the epitaxial layer may be grown as separate layers in multiple steps.

Figure 2A:
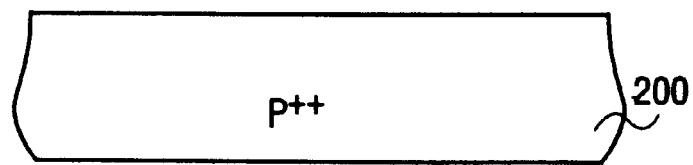
FIG. 2a illustrates a cross-sectional view of a highly doped p-type layer.
Figure 2B:
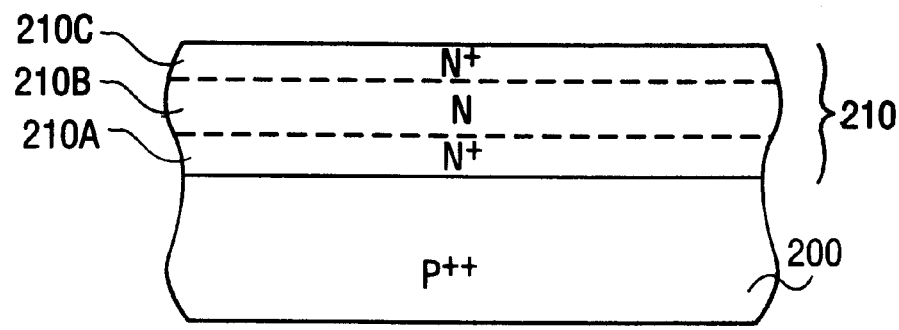
FIG. 2b illustrates the p-type layer of FIG. 2a after an n-type well has been epitaxially grown thereon according to the concepts of the present invention.

FIG. 2a illustrates a highly doped p-type layer ($P^{++}$ layer) 200. Next a well 210 is grown epitaxially above $P^{++}$ layer 200. As illustrated in FIG. 2b, one embodiment of the present invention grows an n-type epitaxial silicon layer. As the epitaxial silicon layer 210 is being grown the dopant level is changed so that sublayers are formed. In one embodiment of the present invention, the first sublayer is a highly doped sublayer 210a, the second layer is a lower doped sublayer (or may even be an undoped sublayer) 210b, and the third sublayer is also a highly doped sublayer 210c.

Growing the well epitaxially enables the use of varying dopant levels minimizing the problems of dopant diffusion that the prior art exhibits when implanting dopants by ion implantation and activating the dopants using high temperatures. Additionally the use of epitaxial grown wells enables the placement of dopants where it is advantageous, for example, higher dopant concentrations can be placed in areas where electrical isolation is a concern and lower doped areas can be formed in areas where electrical isolation is not as great a concern in order to reduce parasitic capacitance.

Figure 2C:
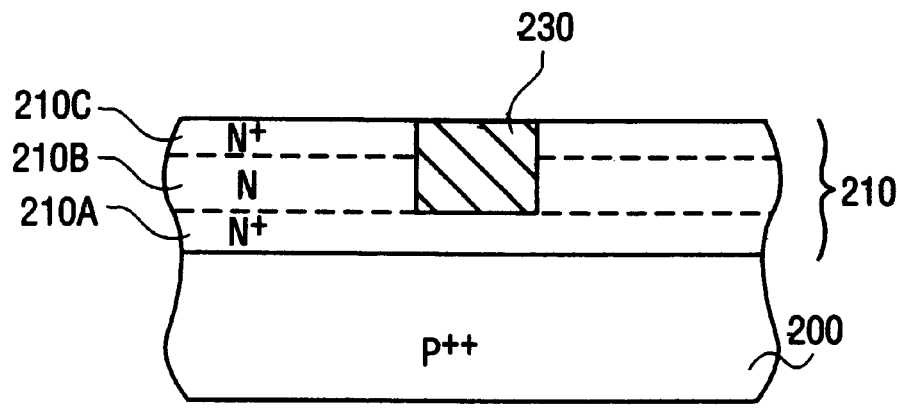
FIG. 2c illustrates the structure of FIG. 2b after a trench has been formed in the well.

FIG. 2c illustrates a trench 230 formed in the epitaxial grown well 210. As illustrated in this particular embodiment, trench 230 is cut at least as deep as the highly doped epitaxial sublayer 210a. It should be noted that the use of a highly doped epitaxial sublayer below the trench improves the electrical isolation properties of the well.

Figure 2D:
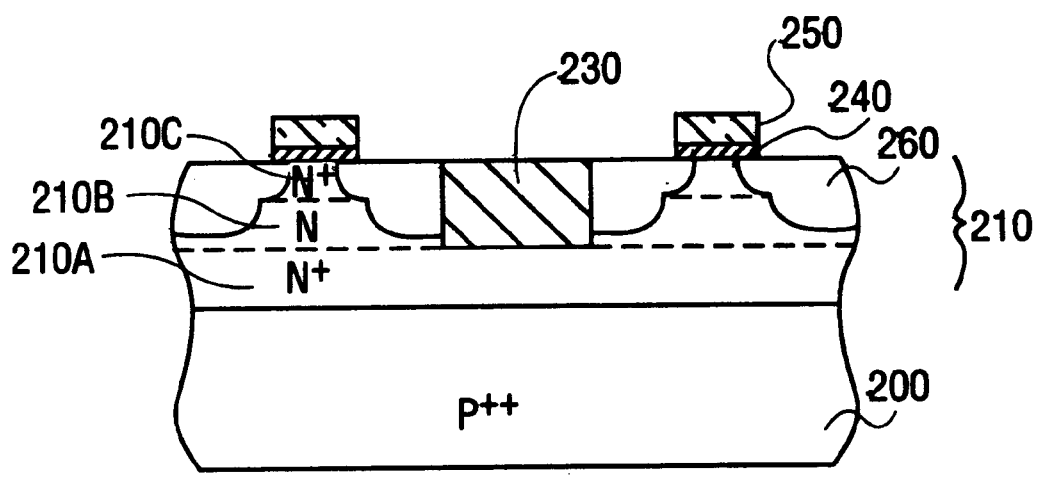
FIG. 2d illustrates the structure of FIG. 2c after transistors have been formed in the well.

FIG. 2d illustrates transistors formed in the epitaxial grown well 210. Higher doped sublayer 210c electrically isolates the source region from the drain regions 260 in the transistor and increases the threshold voltage that each transistor can withstand. Lesser doped sublayer 210b (or undoped sublayer as the case may be) is formed in a region of the transistor where electrical isolation is not as great a concern and because the dopant concentration is reduced the problem of parasitic capacitance is reduced. As stated earlier, highly doped epitaxial sublayer 210a is, formed in the deeper region where trench 230 does not reach in order to improve the electrical isolation of the semiconductor transistors formed on opposite sides of trench 230 and other semiconductor devices in the underlying layers.

As stated earlier, it should be noted that all the deposition and patterning processes of trenches and device layers, such as photoresist masking and etching trench oxide and gate layer, are well known in the art and are therefore not described in detail herein. Additionally, the processes for forming the source and drain regions are also well known in the art and therefore the detail of such processes is not described.

Figure 3A:
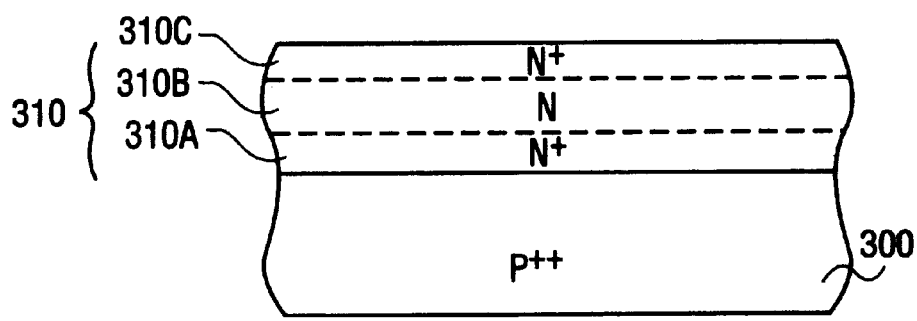
FIG. 3a illustrates a cross-sectional view of a highly doped p-type layer having an n-type well formed thereon according to the concepts of the present invention.

FIGS. 3a–3e illustrate another embodiment of the present invention where epitaxially grown wells are used to form a CMOS device. FIG. 3a illustrates a highly doped p-type layer ($P^{++}$ layer) 300 having an n-type well (n-well) 310 grown thereon. N-well 310 is an epitaxial grown layer with multiple sublayers formed in accordance with the present invention. In one embodiment of the present invention, the first n-type sublayer is a highly doped $n^+$ sublayer 310a, the second n-type sublayer is a lower doped n sublayer (or may even be an undoped n sublayer) 310b, and the third n-type sublayer is also a highly doped $n^+$ sublayer 310c. It should be noted that other arrangements may be used and more sublayers may be added depending upon the desired doping patterns and particular semiconductor device being formed in the well.

Figure 3B:
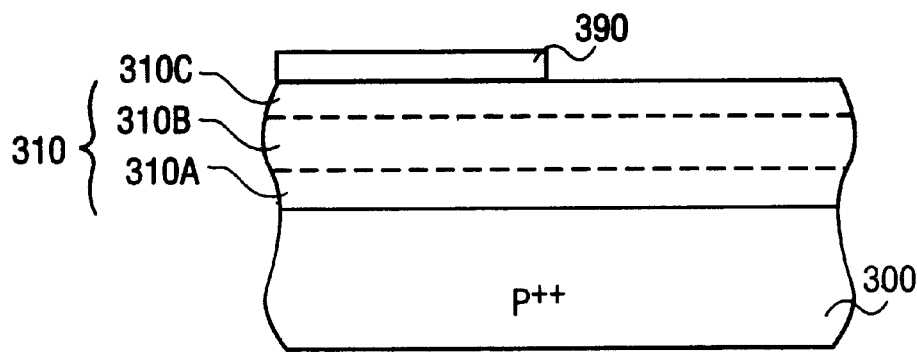
FIG. 3b illustrates the structure of FIG. 3a having a patterned photoresist thereon.
Figure 3C:
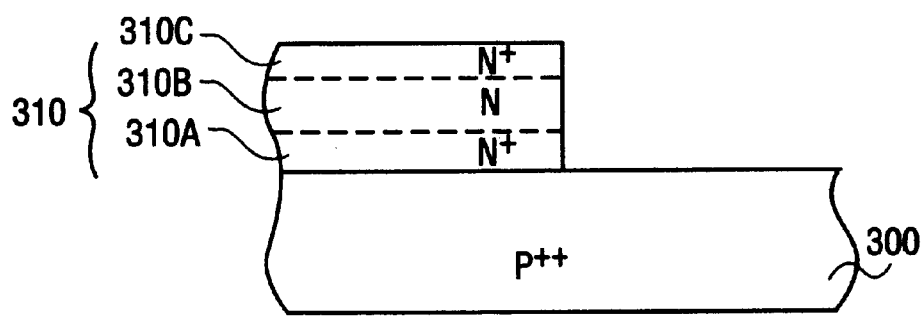
FIG. 3c illustrates the structure of FIG. 3b after the n-well has been patterned and the photoresist layer has been removed.
Figure 3D:
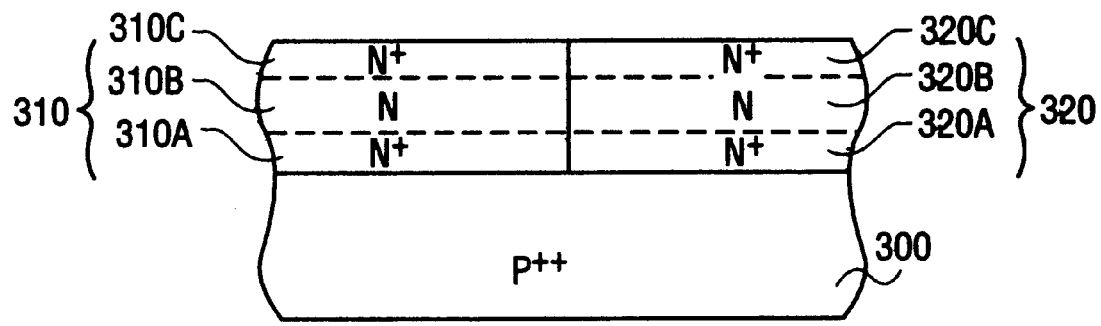
FIG. 3d illustrates the structure of FIG. 3c after a p-type well has been selectively grown thereon according to the concepts of the present invention.

FIG. 3b illustrates patterned photoresist 390 which is used to pattern n-well 310. FIG. 3c illustrates n-well 310 after patterning and photoresist 390 has been removed. As illustrated in FIG. 3d a p-type well (p-well) 320 is then selectively epitaxially grown where the portion of n-well 310 was removed. P-well 320 is grown in accordance with the present invention such that multiple sublayers with varying dopant concentrations are formed. In one embodiment of the present invention, p-well 320 is grown with similar dopant patterns as n-well 310. For example, the first p-type sublayer is a highly doped $p^+$ sublayer 320a, the second p-type sublayer is a lower doped p sublayer (or may even be an undoped p sublayer) 320b, and the third p-type sublayer is also a highly doped $p^+$ sublayer 320c. It should be noted that other arrangements may be used and more sublayers may be added depending upon the desired doping patterns and particular semiconductor device being formed in the well. Additionally, p-well 320 may be formed with a different dopant pattern from that of n-well 310.

Figure 3E:
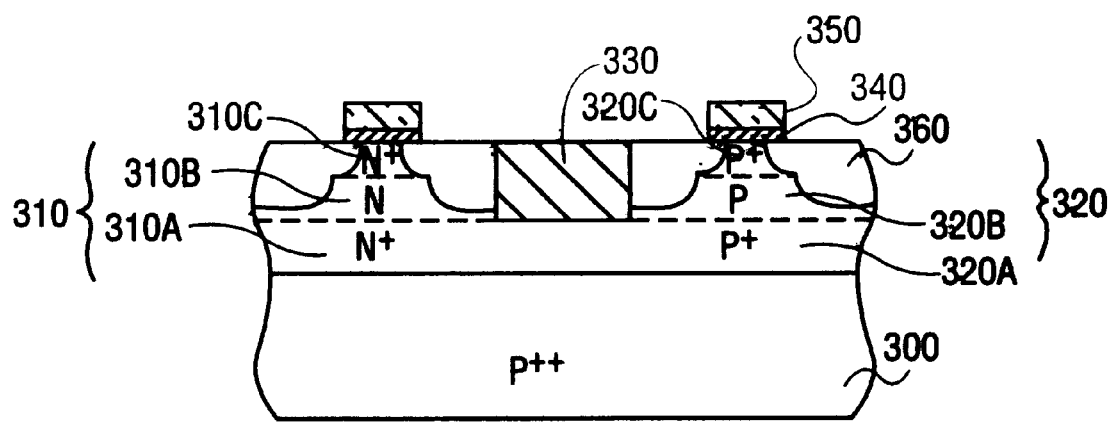
FIG. 3e illustrates the structure of FIG. 3d after transistors have been formed in the n-well and p-well.

FIG. 3e illustrates the completed CMOS device having trench 330 formed between n-well 310 and p-well 320, a transistor formed in n-well 310, and a transistor formed in p-well 320. Similar to the device illustrated in FIG. 2d, trench 330 is formed at least as deep as the highly doped epitaxial sublayers 310a and 320a in order to improve the electrical isolation properties of the two wells. Also, higher doped sublayers 310c and 320c electrically isolate the source region from the drain regions 360 in each of their respective transistors and increase the threshold voltage that each transistor can withstand. Additionally, lesser doped sublayers 310b and 320b (or undoped sublayers as the case may be) are formed in a region of the transistors where electrical isolation is not as great a concern. Since the dopant concentration in sublayers 310b and 320b are reduced the problem of parasitic capacitance for each transistor is also reduced.

It should be noted that although the CMOS device is described above as having the n-type well grown first and the p-type well grown second the order of growth may be reversed and still preserve the essence of the present invention. The drawings and examples are merely to be illustrative of the present invention and should not be used to limit the scope of the invention. The use of epitaxial growing processes facilitates the growth of graded junctions.

Figure 4:
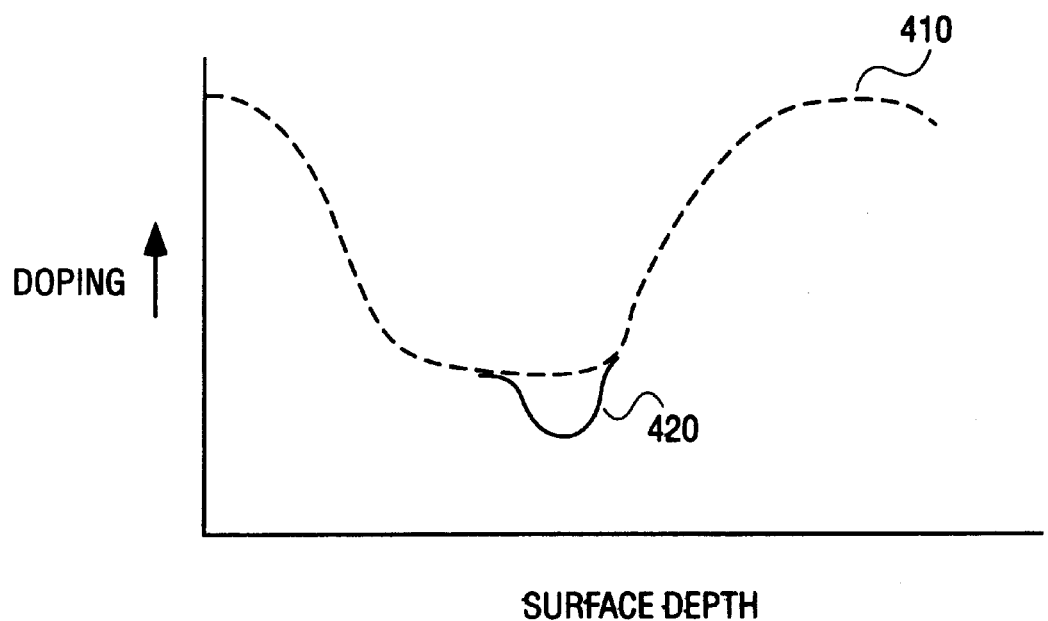
FIG. 4 graphically illustrates the dopant profile of a well having been doped using prior art techniques.
Figure 5:
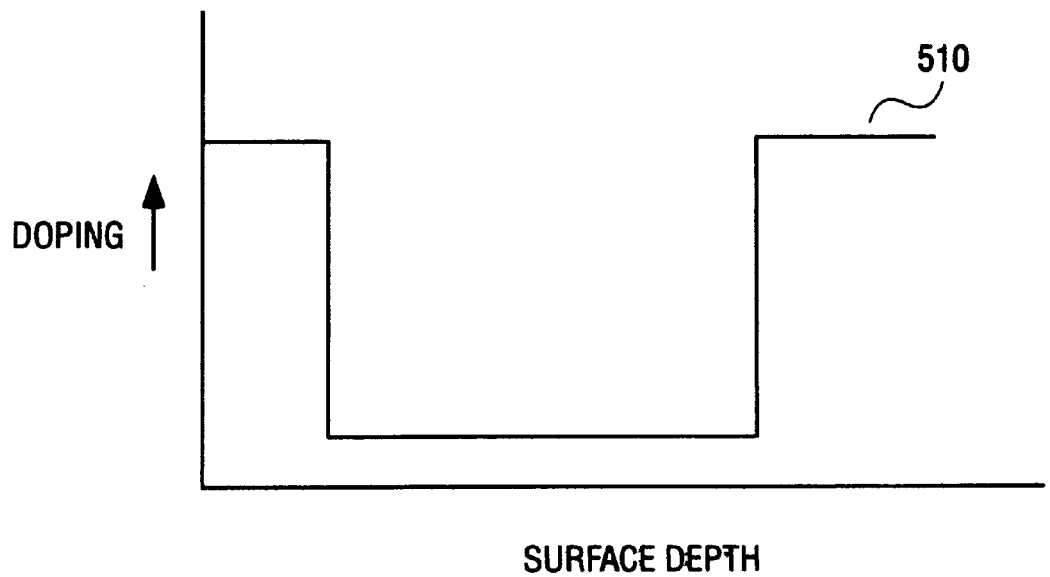
FIG. 5 graphically illustrates the dopant profile of a well having been formed in accordance with the concepts of the present invention.

FIGS. 4 and 5 graphically illustrate the difference between the dopant profile of an ion implantation well and an epitaxially grown implant well, respectively. As illustrated in FIG. 4, the prior art method of implanting dopants into the well does not have very graded or definitive junctions as illustrated by line 410. This is due in large part to the diffusion of dopants from one region to another which is a problem with ion implantation processes. Line 420 in FIG. 4 illustrates the change in the dopant profile when deep retrograde wells and compensation implants are used. As shown, the retrograde well and compensation implant technique does not improve the abruptness and definitiveness of the junctions because compensation implants also use ion implantation techniques.

As illustrated in FIG. 5, however, the use of epitaxially grown wells enables to formation of a dopant profile with very definitive boundaries and graded junctions. The use of epitaxial growth improves the control over the dopant structure and enables the placement of a high concentration of dopants in regions where electrical isolation is an issue. The use of epitaxial grown wells also enables the placement of lower doped regions in areas where electrical isolation is not as great a concern in order to reduce the problem of parasitic capacitance. Therefore, the present invention results in more graded junctions, improved dopant profiles, and much better control over placement of dopant concentration.

Thus, a Semiconductor Device and a Method for Forming a Semiconductor Device Using Epitaxially Grown Wells for Reducing Junction Capacitances has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method of forming wells comprising:

growing an epitaxial silicon layer, wherein said epitaxial layer has at least three epitaxial silicon sublayers:
a first highly doped epitaxial silicon sublayer;
a second lower doped epitaxial silicon sublayer over the first highly doped epitaxial silicon sublayer; and
a third highly doped epitaxial silicon sublayer over the second lower doped epitaxial silicon sublayer.

2. The method as described in claim 1 further comprising the steps of:

forming a trench in said epitaxial silicon layer.

3. The method as described in claim 2 where in said trench is formed such that it has a depth at least as deep as said second lower doped epitaxial silicon sublayer.

4. The method as described in claim 2 further comprising the steps of:

filling said trench; and
planarizing said trench.

5. The method as described in claim 2 further comprising the steps of:

forming a semiconductor device to the side of said trench.

6. The method as described in claim 5 further comprising the steps of:

depositing a thin spacer layer;

depositing a gate layer;

patterning said thin spacer layer and said gate layer into a gate electrode;

forming a source region and a drain region.

7. The method as described in claim 1 wherein said epitaxial silicon layer is selected from the group consisting of n-type and p-type epitaxial silicon.

8. The method as described in claim 6 wherein said thin spacer layer is selected from the group consisting of nitride and oxide layers.

9. A method of forming twin wells comprising:

growing a first epitaxial silicon layer of a first dopant, wherein said first epitaxial layer has at least three epitaxial silicon sublayers:

a first highly doped epitaxial silicon sublayer of said first dopant;

a second lower doped epitaxial silicon sublayer of said first dopant over the first highly doped epitaxial silicon sublayer of said first dopant;

a third highly doped epitaxial silicon sublayer of said first dopant over the second lower doped epitaxial silicon sublayer of said first dopant;

patterning said first epitaxial silicon layer into a first well;

selectively growing a second epitaxial silicon layer of a second dopant, wherein said second epitaxial layer has at least three epitaxial silicon sublayers:

a first highly doped epitaxial silicon sublayer of said second dopant;

a second lower doped epitaxial silicon sublayer of said second dopant over the first highly doped epitaxial silicon sublayer of said second dopant;

a third highly doped epitaxial silicon sublayer of said second dopant over the second lower doped epitaxial silicon sublayer of said second dopant.

10. The method as described in claim 9 further comprising the steps of:

forming a trench between said first epitaxial silicon layer and said second epitaxial silicon layer.

11. The method as described in claim 10 where in said trench is formed such that it has a depth at least as deep as said second lower doped epitaxial silicon sublayer of said first dopant and said second dopant.

12. The method as described in claim 10 further comprising the steps of:

filling said trench; and planarizing said trench.

13. The method as described in claim 10 further comprising the steps of:

forming a semiconductor device to the side of said trench.

14. The method as described in claim 13 further comprising the steps of:

depositing a thin spacer layer;

depositing a gate layer;

patterning said thin spacer layer and said gate layer into a gate electrode;

forming a source region and a drain region.

15. The method as described in claim 9 wherein said epitaxial silicon layer is selected from the group consisting of n-type and p-type epitaxial silicon.

16. The method as described in claim 14 wherein said thin spacer layer is selected from the group consisting of nitride and oxide layers.

* * * * *

UNITED STATES PATENT AND TRADEMARK OFFICE
CERTIFICATE OF CORRECTION

Figure 1A:
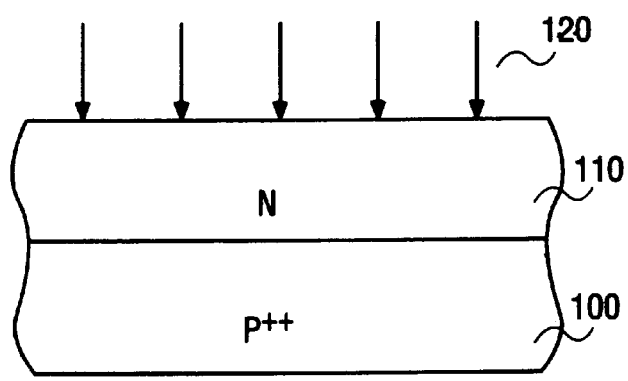
FIG. 1a illustrates a cross-sectional view of a well being doped using the prior art technique of ion implantation.
Figure 1B:
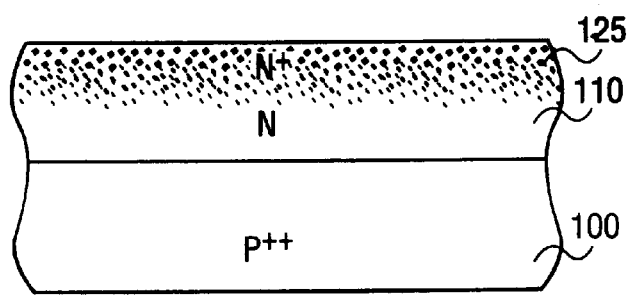
FIG. 1b illustrates the well of FIG. 1a after doping using the prior art technique.
Figure 1C:
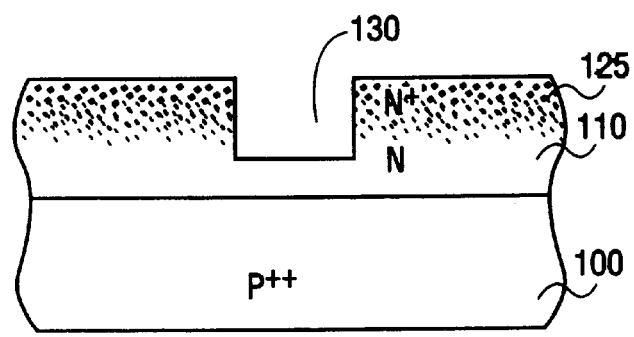
FIG. 1c illustrates the well of FIG. 1b after a trench has been etched therein.
Figure 1D:
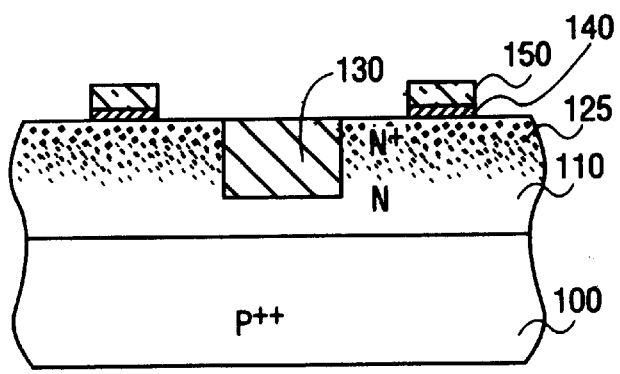
FIG. 1d illustrates the well of FIG. 1c after the trench has been filled and gate and oxide layers have been patterned into a gate electrode.
Figure 1E:
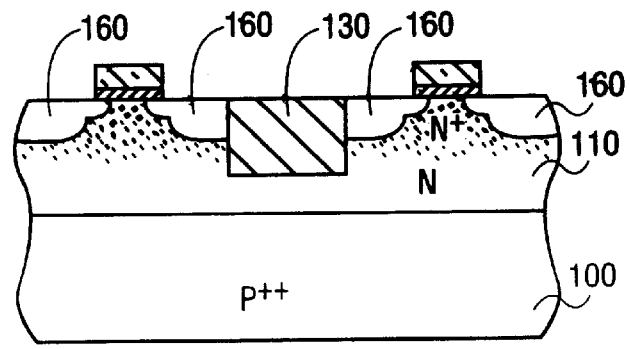
FIG. 1e illustrates the well of FIG. 1d after the transistors have been completed by the formation of source and drain regions.
Figure 1F:
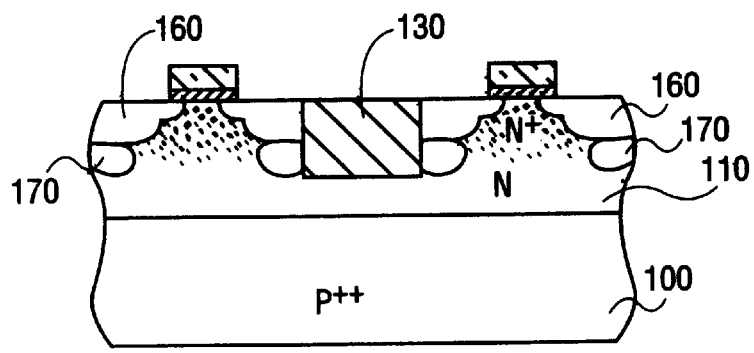
FIG. 1f illustrates the well of FIG. 1d after the formation of retrograde wells using yet another prior art technique.

PATENT NO.     : 6,200,879 B1                                                Page 1 of 1
DATED          : March 13, 2001
INVENTOR(S)    : Sunit Tyagi It is certified that error appears in the above-identified patent and that said Letters Patent is hereby corrected as shown below:

Drawings,
After the title FIG. 1A in the drawings, insert the legend -- (PRIOR ART) --.
After the title FIG. 1B in the drawings, insert the legend -- (PRIOR ART) --.
After the title FIG. 1C in the drawings, insert the legend -- (PRIOR ART) --.
After the title FIG. 1D in the drawings, insert the legend -- (PRIOR ART) --.
After the title FIG. 1E in the drawings, insert the legend -- (PRIOR ART) --.
After the title FIG. 1F in the drawings, insert the legend -- (PRIOR ART) --.
After the title FIG. 1G in the drawings, insert the legend -- (PRIOR ART) --.

Column 2,
Line 30, delete "shell" and insert -- well --.

Signed and Sealed this

Thirteenth Day of August, 2002

Attest:

Attesting Officer

JAMES E. ROGAN
*Director of the United States Patent and Trademark Office*